US010659002B2

(12) United States Patent
Yamamoto et al.

(10) Patent No.: US 10,659,002 B2
(45) Date of Patent: May 19, 2020

(54) ELASTIC WAVE DEVICE

(71) Applicant: Murata Manufacturing Co., Ltd., Nagaokakyo-shi, Kyoto-fu (JP)

(72) Inventors: Koji Yamamoto, Nagaokakyo (JP); Tsutomu Takai, Nagaokakyo (JP); Seiji Kai, Nagaokakyo (JP); Hisashi Yamazaki, Nagaokakyo (JP); Yuji Miwa, Nagaokakyo (JP); Takashi Yamane, Nagaokakyo (JP); Noriyoshi Ota, Nagaokakyo (JP); Atsushi Tanaka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/108,165

(22) Filed: Aug. 22, 2018

(65) Prior Publication Data

US 2018/0358950 A1 Dec. 13, 2018

Related U.S. Application Data

(63) Continuation-in-part of application No. 15/831,471, filed on Dec. 5, 2017, which is a continuation of (Continued)

(30) Foreign Application Priority Data

Jun. 25, 2015 (JP) .................................. 2015-127150

(51) Int. Cl.
*H03H 9/02* (2006.01)
*H03H 9/10* (2006.01)
(Continued)

(52) U.S. Cl.
CPC .... *H03H 9/02574* (2013.01); *H03H 9/02826* (2013.01); *H03H 9/02866* (2013.01); (Continued)

(58) Field of Classification Search
CPC ........... H03H 9/02574; H03H 9/02826; H03H 9/02897; H03H 9/1071; H03H 9/1092; (Continued)

(56) References Cited

U.S. PATENT DOCUMENTS 6,996,882 B2 * 2/2006 Onishi ................ H03H 9/0222
29/25.35
9,831,850 B2 * 11/2017 Kuroyanagi ....... H03H 9/02992
(Continued)

OTHER PUBLICATIONS

Yamamoto et al., "Elastic Wave Device", U.S. Appl. No. 15/831,471, filed Dec. 5, 2017.

*Primary Examiner* — Barbara Summons
(74) *Attorney, Agent, or Firm* — Keating & Bennett, LLP (57) ABSTRACT

An elastic wave device includes a lamination layer film including a piezoelectric thin film on a support substrate. The lamination layer film is not partially present in a region located in an outer side portion of a region where IDT electrodes are provided. A first insulation layer extends from at least a portion of a region where the lamination layer film is not present to an upper portion of the piezoelectric thin film. A wiring electrode has a width of about 6 μm and extends from the upper portion of the piezoelectric thin film to an upper portion of the first insulation layer, and extends onto a section of the first insulation layer in the region.

19 Claims, 10 Drawing Sheets

Related U.S. Application Data application No. PCT/JP2016/067409, filed on Jun. 10, 2016.

(51) Int. Cl.
*H03H 9/05* (2006.01)
*H03H 9/64* (2006.01)

(52) U.S. Cl.
CPC .... *H03H 9/02897* (2013.01); *H03H 9/02992* (2013.01); *H03H 9/059* (2013.01); *H03H 9/1071* (2013.01); *H03H 9/6489* (2013.01)

(58) Field of Classification Search
CPC .......... H03H 9/145; H03H 9/178; H03H 9/25; H03H 9/547; H03H 9/64; H03H 9/02866; H03H 9/02992; H03H 9/14544; H03H 9/0561; H03H 9/059; H03H 9/6489
USPC .............................. 333/193–196; 310/313 B
See application file for complete search history.

(56) References Cited

U.S. PATENT DOCUMENTS

| | | | |
|---|---|---|---|
| 10,148,245 B2 * | 12/2018 | Kai | H03H 9/02574 |
| 2013/0285768 A1 * | 10/2013 | Watanabe | H03H 9/0222 |
| | | | 333/193 |
| 2014/0354114 A1 * | 12/2014 | Moriya | B06B 1/0662 |
| | | | 310/334 |

* cited by examiner

ELASTIC WAVE DEVICE

CROSS REFERENCE TO RELATED APPLICATIONS

This application claims the benefit of priority to Japanese Patent Application No. 2015-127150 filed on Jun. 25, 2015 and is a Continuation Application of PCT Application No. PCT/JP2016/067409 filed on Jun. 10, 2016. The entire contents of each application are hereby incorporated herein by reference.

BACKGROUND OF THE INVENTION

1. Field of the Invention

The present invention relates to an elastic wave device in which a lamination layer film and a piezoelectric thin film are laminated on a support substrate.

2. Description of the Related Art

A lamination layer film is provided on a support substrate in an elastic wave device disclosed in WO 2012/086639A1. A piezoelectric thin film is laminated on the lamination layer film. The lamination layer film includes a high acoustic velocity film and a low acoustic velocity film. The low acoustic velocity film is formed of a film where an acoustic velocity of a bulk wave propagating therein is smaller than an acoustic velocity of a bulk wave propagating in the piezoelectric thin film. The high acoustic velocity film is formed of a film where an acoustic velocity of a bulk wave propagating therein is larger than an acoustic velocity of an elastic wave propagating in the piezoelectric thin film.

In the elastic wave device disclosed in WO 2012/086639A1, the piezoelectric thin film is made of a piezoelectric single crystal, such as $LiTaO_3$ or the like. Because of this, the piezoelectric thin film is likely to be cracked or chipped by external force. In the elastic wave device, an external connection terminal, such as a bump or the like, is bonded for external connection. In a bonding process of the external connection terminal, stress is applied to a multilayer body including the piezoelectric thin film and the lamination layer film. This increases a risk that cracking, chipping, or the like of the piezoelectric thin film is generated.

In general, an elastic wave device is obtained by cutting a mother structure with a dicing machine. The force applied during the cutting with the dicing machine also raises a risk that cracking, chipping, or the like of the piezoelectric thin film is generated.

Further, there is a risk that interfacial peeling is generated in a multilayer body including the piezoelectric thin film at a time of connecting an external connection terminal, cutting with a dicing machine, or the like.

Furthermore, in the structure in which the piezoelectric thin film is provided on the lamination layer film, a wiring electrode needs to be provided so as to extend from an upper portion of the support substrate to an upper portion of the piezoelectric thin film. In this case, there is a problem in that breaking of the wiring electrode is likely to be generated.

SUMMARY OF THE INVENTION

Preferred embodiments of the present invention provide elastic wave devices in which cracking, chipping, or other damage of a piezoelectric thin film is unlikely to be generated, interfacial peeling is unlikely to be generated in a lamination layer film, and breaking of a wiring electrode is unlikely to be generated.

An elastic wave device according to a preferred embodiment of the present invention includes a support substrate; a lamination layer film provided on the support substrate and including a plurality of films including a piezoelectric thin film; an interdigital transducer (IDT) electrode provided on one surface of the piezoelectric thin film; a first insulation layer that is provided in a region located in an outer side portion of a region where the IDT electrode is provided so as to extend from at least a portion of a region where the lamination layer film is not present to an upper portion of the piezoelectric thin film in a plan view; and a wiring electrode, electrically connected to the IDT electrode, that extends from the upper portion of the piezoelectric thin film to an upper portion of the first insulation layer, and further extends onto a section of the first insulation layer positioned in the region where the lamination layer film is not present, wherein a width of the wiring electrode is no less than about 6 μm.

In an elastic wave device according to a preferred embodiment of the present invention, the first insulation layer has a rounded shape on the piezoelectric thin film.

In an elastic wave device according to a preferred embodiment of the present invention, the first insulation layer extends from the upper portion of the piezoelectric thin film, while passing over a side surface of the lamination layer film, to at least the portion of the region where the lamination layer film is not present. In this case, peeling inside the lamination layer film is able to be reduced or prevented more effectively.

In an elastic wave device according to a preferred embodiment of the present invention, a surface on the first insulation layer, which is on the opposite side to the support substrate, includes a slope that approaches the piezoelectric thin film side as the slope approaches a section positioned on the piezoelectric thin film from the region where the lamination layer film is not present. In this case, breaking of the wiring electrode provided on the first insulation layer is less likely to be generated.

In an elastic wave device according to a preferred embodiment of the present invention, the slope of the first insulation layer extends from an upper portion of the support substrate to a section of the first insulation layer on the piezoelectric thin film.

In an elastic wave device according to a preferred embodiment of the present invention, the first insulation layer extends from the slope to the region where the lamination layer film is not present.

In an elastic wave device according to a preferred embodiment of the present invention, the elastic wave device further includes a support layer, on the support substrate, that covers a portion of a region where the wiring electrode is provided and includes a cavity defining a hollow space. The support layer extends beyond the slope of the first insulation layer to the upper portion of the first insulation layer on the piezoelectric thin film.

In an elastic wave device according to a preferred embodiment of the present invention, the elastic wave device further includes a support layer that is provided on the support substrate and includes a cavity defining a hollow space. The support layer extends, on the support substrate, from the region where the wiring electrode is provided to an end portion on the piezoelectric thin film side of the slope.

In an elastic wave device according to a preferred embodiment of the present invention, the elastic wave device further includes a second insulation layer provided between the wiring electrode and the support substrate, and the second insulation layer extends to the upper portion of the first insulation layer.

In an elastic wave device according to a preferred embodiment of the present invention, in the case where a direction orthogonal or substantially orthogonal to a direction in which the wiring electrode extends is denoted as a width direction, one end and another end in the width direction of the wiring electrode are respectively positioned on an inner side in the width direction relative to one end and another end in the width direction of the second insulation layer. In this case, it is possible to effectively reduce or prevent the wiring electrode from being short-circuited with other portions.

In another preferred embodiment of an elastic wave device according to the present invention, the slope spaced from the support substrate side as the slope extends from the piezoelectric thin film side towards a side of the region where the lamination layer film is not present, and the first insulation layer is thicker in the region where the lamination layer film is not present than in the region on the piezoelectric thin film.

In an elastic wave device according to a preferred embodiment of the present invention, the lamination layer film includes the piezoelectric thin film and a low acoustic velocity film where an acoustic velocity of a bulk wave propagating therein is smaller than an acoustic velocity of an elastic wave propagating in the piezoelectric thin film, and the piezoelectric thin film is laminated on the low acoustic velocity film.

In an elastic wave device according to a preferred embodiment of the present invention, the lamination layer film includes the piezoelectric thin film, a high acoustic velocity film where an acoustic velocity of a bulk wave propagating therein is larger than an acoustic velocity of an elastic wave propagating in the piezoelectric thin film, and a low acoustic velocity film, laminated on the high acoustic velocity film, where an acoustic velocity of a bulk wave propagating therein is smaller than the acoustic velocity of the elastic wave propagating in the piezoelectric thin film. The piezoelectric thin film is laminated on the low acoustic velocity film. In this case, the elastic wave is able to be effectively confined in the piezoelectric thin film.

In an elastic wave device according to a preferred embodiment of the present invention, the lamination layer film includes the piezoelectric thin film, a high acoustic impedance film having relatively high acoustic impedance, and a low acoustic impedance film having lower acoustic impedance than the high acoustic impedance film. In this case, the elastic wave is able to be effectively confined in the piezoelectric thin film.

With elastic wave devices according to various preferred embodiments of the present invention, cracking, chipping, or other damage of the piezoelectric thin film is effectively reduced or prevented. Further, interfacial peeling inside the lamination layer film is unlikely to be generated. Furthermore, breaking of the wiring electrode is also unlikely to be generated.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described with reference to the drawings.

It is to be noted that the preferred embodiments described in the present specification are merely examples, and that configurations may be partially replaced or combined with each other between different preferred embodiments.

Figure 1:
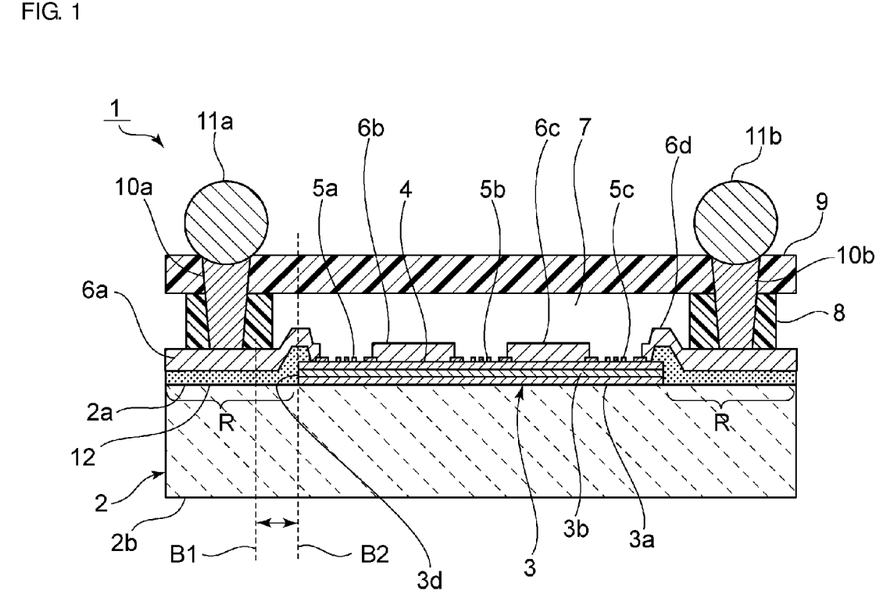
FIG. 1 is a front cross-sectional view of an elastic wave device according to a first preferred embodiment of the present invention.

FIG. 1 is a front cross-sectional view of an elastic wave device according to a first preferred embodiment of the present invention.

An elastic wave device 1 includes a support substrate 2. The support substrate 2 includes first and second principal surfaces 2a and 2b opposing each other. A lamination layer film 3 is provided on the first principal surface 2a. The lamination layer film 3 includes a high acoustic velocity film 3a, a low acoustic velocity film 3b laminated on the high acoustic velocity film 3a, and a piezoelectric thin film 4 laminated on the low acoustic velocity film 3b. The piezoelectric thin film 4 is positioned at the uppermost portion in the lamination layer film 3. The high acoustic velocity film 3a is a film in which an acoustic velocity of a bulk wave propagating therein is larger than an acoustic velocity of an elastic wave propagating in the piezoelectric thin film 4. The low acoustic velocity film 3b is a film in which an acoustic velocity of a bulk wave propagating therein is smaller than the acoustic velocity of the elastic wave propagating in the piezoelectric thin film 4.

A material of the piezoelectric thin film is not limited to any specific material, and one of $LiTaO_3$, $LiNbO_3$, ZnO, AlN, and PZT, for example, may preferably be used. The piezoelectric thin film 4 is preferably made of $LiTaO_3$ in the present preferred embodiment. Note that, however, another piezoelectric single crystal may be used. In the case where a wave length of an elastic wave, which is determined by an electrode period of an IDT electrode, is denoted as λ, a film thickness of the piezoelectric thin film 4 is preferably no more than about 1.5λ, for example. This is because, in this case, an electromechanical coupling coefficient is able to be adjusted with ease by selecting the film thickness of the piezoelectric thin film 4 within a range of no more than about 1.5λ, for example.

The high acoustic velocity film 3a is made of an appropriate material satisfying the above-mentioned acoustic velocity relationship. As such material, the following may preferably be used: aluminum nitride; aluminum oxide; silicon carbide; silicon nitride; silicon oxynitride; a DLC film; silicon; sapphire; lithium tantalate; lithium niobate; a piezoelectric material such as crystal; various types of ceramics such as alumina, zirconia, cordierite, mullite, steatite, forsterite, and the like; magnesia; diamond; and so on. A material whose main ingredient is selected from the above-mentioned materials or a material whose main ingredient is a mixture of some of the above-mentioned materials may preferably be used.

The low acoustic velocity film 3b is made of an appropriate material in which the bulk wave propagates at a lower acoustic velocity than the acoustic velocity of the elastic wave propagating in the piezoelectric thin film 4. As such material, the following may preferably be used: silicon oxide, glass, silicon oxynitride, tantalum oxide, a compound in which fluorine, carbon, boron, or the like is added to silicon oxide, and so on. The low acoustic velocity film 3b may also preferably be made of a mixed material whose main ingredient is selected from the above-mentioned materials.

The acoustic velocity of a bulk wave is an acoustic velocity specific to each material. A P wave vibrates in a traveling direction of the wave, that is, in a longitudinal direction, and an S wave vibrates in a transverse direction which is a direction perpendicular or substantially perpendicular to the traveling direction. The bulk wave propagates in any of the piezoelectric thin film 4, the high acoustic velocity film 3a, and the low acoustic velocity film 3b. In the case of an isotropic material, the P wave and the S wave are generated. In the case of an anisotropic material, the P wave, a slow S wave, and a fast S wave are generated. In the case where a surface acoustic wave is excited using an anisotropic material, two S waves, that is, an SH (Shear Horizontal) wave and an SV (Shear Vertical) wave are generated. In the present specification, an acoustic velocity of a main mode elastic wave propagating in the piezoelectric thin film 4 refers to, of three modes of the P wave, SH wave and SV wave, a mode that is used to obtain a pass band as a filter and resonance characteristics as a resonator.

A close contact layer may preferably be provided between the high acoustic velocity film 3a and the piezoelectric thin film 4. Providing the close contact layer makes it possible to improve adhesiveness between the high acoustic velocity film 3a and the piezoelectric thin film 4. It is sufficient for the close contact layer to be resin, metal or other suitable material, and an epoxy resin, a polyimide resin, or other suitable material is preferably used, for example.

Because the high acoustic velocity film 3a and the low acoustic velocity film 3b are laminated to the piezoelectric thin film 4, the Q-value is able to be improved as described in WO 2012/086639A1.

Figure 14:
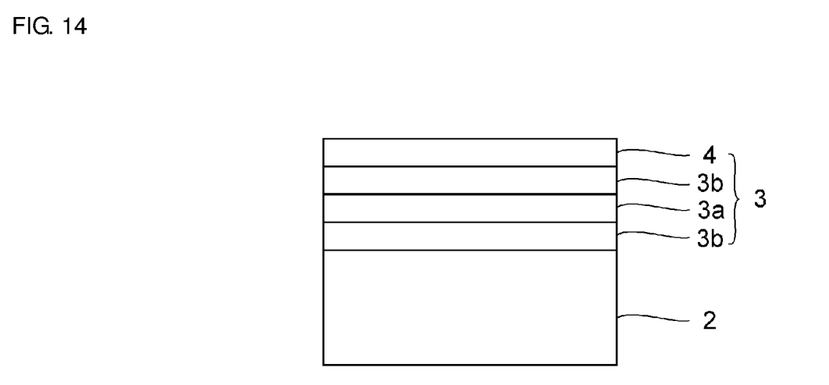
FIG. 14 is a rough front view for describing a variation on a lamination layer film included in a preferred embodiment of the present invention.

A plurality of high acoustic velocity films and a plurality of low acoustic velocity films may preferably be laminated in the lamination layer film 3. For example, as illustrated in a front view in FIG. 14, the low acoustic velocity film 3b, the high acoustic velocity film 3a, the low acoustic velocity film 3b, and the piezoelectric thin film 4 may preferably be laminated on the support substrate 2 in that order from the support substrate 2 side. This makes it possible to effectively confine elastic wave energy to be used to a portion in which the piezoelectric thin film 4 and the low acoustic velocity film 3b are laminated. In addition, it is possible to leak a high-order mode to become spurious radiation toward the support substrate 2 side of the high acoustic velocity film 3a, thus making it possible to reduce or prevent the high-order mode spurious radiation. Accordingly, favorable resonance characteristics, filter characteristics, or other characteristics are able to be obtained with the elastic wave being used, and an unwanted response due to the high-order mode is able to be reduced or prevented. Further, the lamination layer film 3 may preferably include another film, other than the piezoelectric thin film 4, the high acoustic velocity film 3a, and the low acoustic velocity film 3b, such as a dielectric film or other suitable film, for example.

IDT electrodes 5a to 5c are provided on the piezoelectric thin film 4. The IDT electrodes 5a to 5c are electrically connected through wiring electrodes 6a to 6d.

In the present preferred embodiment, surface acoustic wave resonators including a plurality of IDT electrodes 5a to 5c are connected to each other. With this configuration, a band pass filter is provided. Note that the filter circuit is not limited to any one filter circuit.

A hollow space 7 that faces the IDT electrodes 5a to 5c. In other words, a support layer 8 including a cavity is provided on the support substrate 2. The support layer 8 is preferably made of synthetic resin, for example. The support layer 8 may also be made of an inorganic insulative material.

A cover member 9 is provided so as to close the cavity of the support layer 8. The hollow space 7 is sealed with the cover member 9 and the support layer 8.

Meanwhile, through-holes are provided to pass through the support layer 8 and the cover member 9. Under-bump metal layers 10a and 10b are provided in the through-holes. Metal bumps 11a and 11b are respectively bonded to the under-bump metal layers 10a and 10b.

The under-bump metal layers 10a, 10b and the metal bumps 11a, 11b are made of an appropriate metal or alloy, for example.

A lower end of the under-bump metal layer 10a is bonded to the wiring electrode 6a. A lower end of the under-bump metal layer 10b is bonded to the wiring electrode 6d. Accordingly, portions of the wiring electrodes 6a and 6d to which the under-bump metal layers 10a and 10b are respectively bonded become electrode land sections to which external connection terminals are connected. In the present preferred embodiment, the metal bumps 11a and 11b are provided as the external connection terminals.

Meanwhile, a first insulation layer 12 is provided on the support substrate 2. The first insulation layer 12 is preferably made of synthetic resin, for example. As the synthetic resin, polyimide, epoxy, or other suitable resin may be used. The first insulation layer 12 may also be made of an inorganic insulative material, and a material for the first insulation layer 12 is not limited to any specific one. For example, as the material for the first insulation layer 12, an appropriate material, such as SOG, $SiO_2$, TEOS, SiN, or other suitable material may preferably be used.

Note that the structure in which the lamination layer film 3 is laminated is not partially present on the support substrate 2. In other words, a region R where the lamination layer film 3 is not present is provided in an outer side portion of a region where the lamination layer film 3 is provided, on the first principal surface 2a of the support substrate 2. The first insulation layer 12 extends from the region R, while passing over a side surface 3d of the lamination layer film 3, to an upper surface of the piezoelectric thin film 4.

In the elastic wave device 1, the above-described electrode lands are provided within the region R. Because of this, stress generated when bonding the metal bumps 11a and 11b as the external connection terminals, is not directly applied to a laminating section of the lamination layer film 3. Accordingly, cracking, chipping, or other damage of the piezoelectric thin film 4 is unlikely to be generated. Further, interfacial peeling inside the lamination layer film 3 is also unlikely to be generated. The cracking, chipping, or other damage of the piezoelectric thin film and the interfacial peeling as well are unlikely to be generated, not only in a case in which the stress when forming the metal bumps 11a and 11b is applied, but also a case in which the stress when cutting with a dicing machine is applied.

Figure 2:
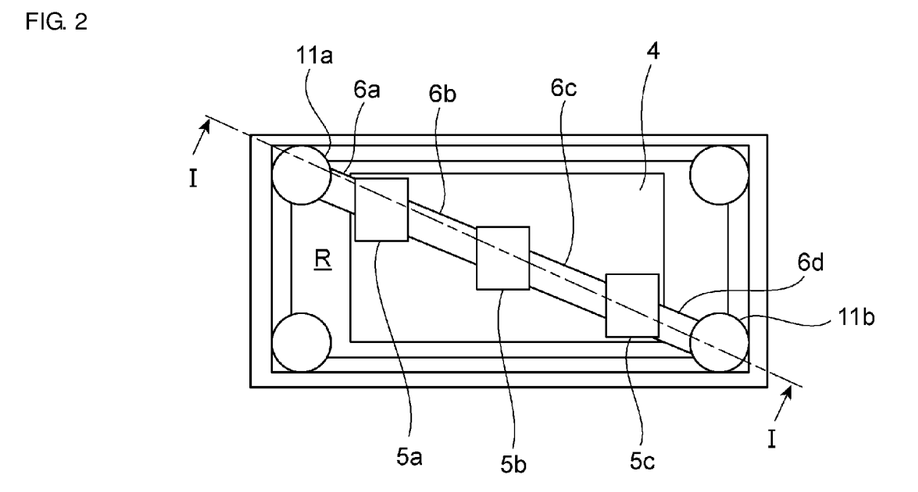
FIG. 2 is a schematic plan view illustrating the elastic wave device with its cover member removed according to the first preferred embodiment of the present invention.
Figure 3:
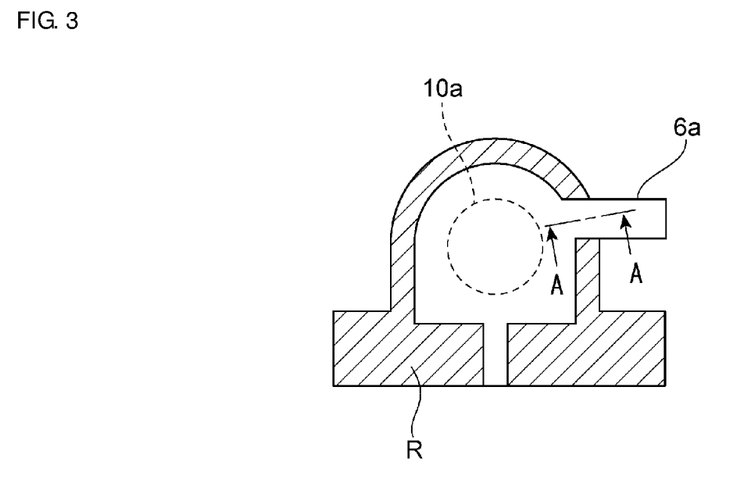
FIG. 3 is a plan view for describing a major section of the elastic wave device according to the first preferred embodiment of the present invention.

FIG. 2 is a schematic plan view of the elastic wave device 1. In FIG. 2, the electrode structure on the lower side is illustrated while making the metal bumps 11a and 11b remain and seeing through the cover member 9. A region in which the IDT electrodes 5a to 5c are provided is illustrated in a rectangular shape. FIG. 1 is a cross-sectional view corresponding to a portion along a line I-I in FIG. 2. Further, details of the wiring electrode 6a where the under-bump metal layer 10a is provided are enlarged and illustrated in FIG. 3. In FIG. 3, the wiring electrode 6a is positioned within the region R. A broken line in FIG. 3 indicates a portion where the under-bump metal layer 10a is bonded.

A portion along line A-A in FIG. 3 corresponds to a portion between a broken line B1 and a broken line B2 in FIG. 1.

Figure 4A:
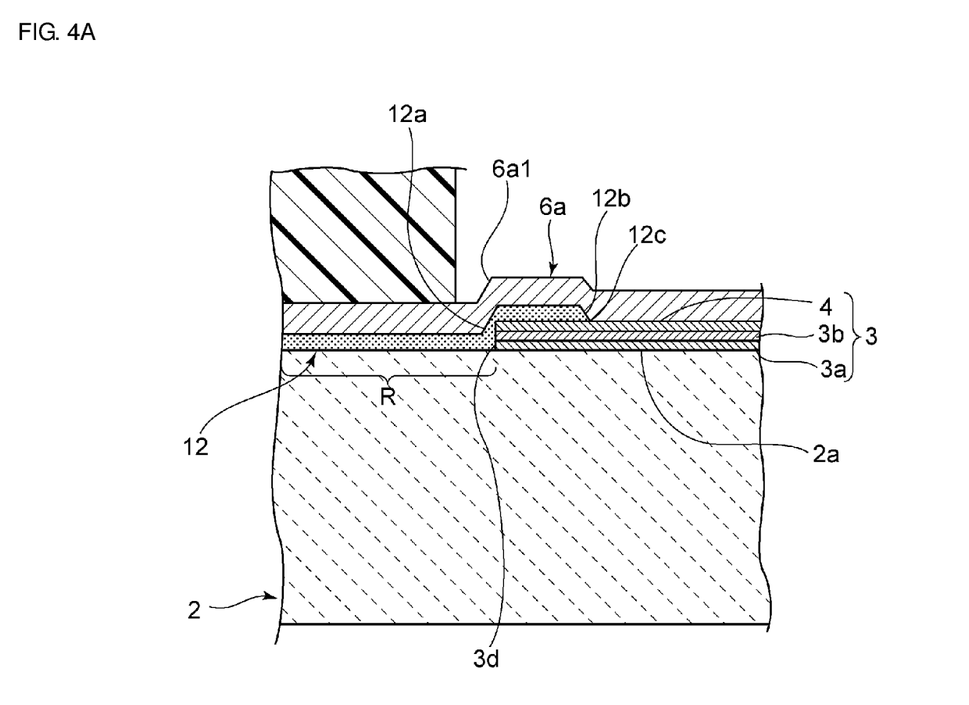
FIG. 4A is a partial cutout enlarged cross-sectional view of a portion along an A-A line in FIG. 3.

FIG. 4A is a partial cutout enlarged cross-sectional view in which the portion indicated by the line A-A, that is, the portion indicated by the broken line B1 and broken line B2 in FIG. 1 is enlarged and illustrated.

As illustrated in FIG. 4A, the first insulation layer extends from a portion positioned in the region R to the upper portion of the piezoelectric thin film 4. In this case, at an upper side of the side surface 3d of the lamination layer film 3, a slope 12a is positioned on a surface of the first insulation layer 12 on the opposite side to the support substrate 2, as enlarged and illustrated in FIG. 4B. The slope 12a is provided so as to approach the piezoelectric thin film 4, in other words, to be distanced from the first principal surface 2a of the support substrate 2 as the slope extends from the upper side of the region R toward the upper side of the piezoelectric thin film 4. This also results in an angle provided between a slope 6a1 of the wiring electrode 6a and the first principal surface 2a being small, as described above. As such, the degree of bend in a portion where the slope 6a1 of the wiring electrode 6a is provided is reduced. In other words, the influence of a step between the first principal surface 2a of the support substrate 2 and the upper surface of the piezoelectric thin film 4 in the region R in an outer side portion of the side surface 3d, is able to be reduced by the first insulation layer 12. This reduces the chances for the wiring electrode 6a to be broken.

Figure 4B:
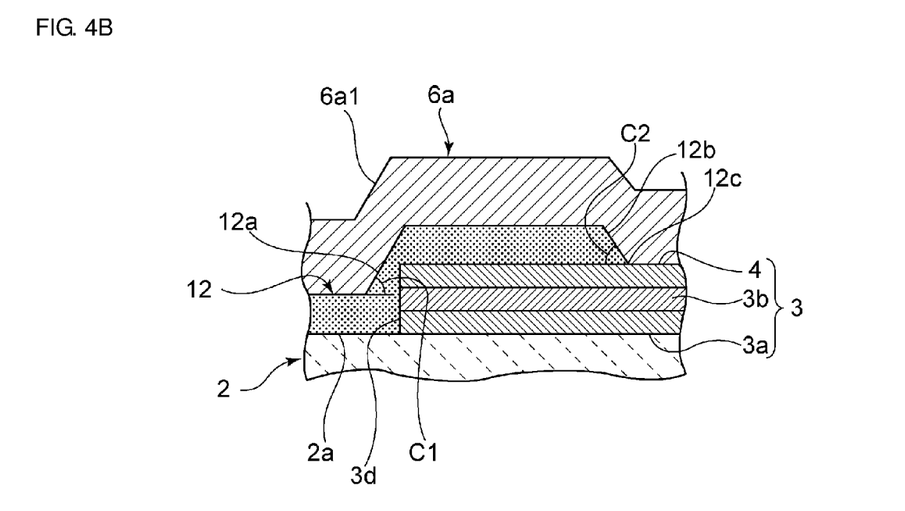
FIG. 4B is a partial cutout cross-sectional view in which a major section of FIG. 4A is enlarged and illustrated.

It is preferable that an angle C1 between the slope 12a and the first principal surface 2a of the support substrate 2 be no more than about 80 degrees, for example.

It is also preferable to provide a slope 12b at an inner side end 12c of the first insulation layer 12. It is preferable that an angle C2 between the slope 12b and the first principal surface 2a be no more than about 80 degrees, for example. This also reduces the chances for the wiring electrode 6a to be broken at the upper side of the slope 12b.

It is more preferable that the angle C1 between the slope 12a and the first principal surface 2a as well as the angle C2 between the slope 12b and the first principal surface 2a be no more than about 60 degrees, for example. It is even more preferable that the angle C1 between the slope 12a and the first principal surface 2a as well as the angle C2 between the slope 12b and the first principal surface 2a be no more than about 45 degrees, for example.

As discussed above, the degree of bend of the wiring electrode 6a is reduced. Accordingly, breaking of the wiring, when heat is applied, is unlikely to be generated, and breaking of the wiring during a formation process of the wiring electrode 6a is also unlikely to be generated.

Further, the side surface 3d of the lamination layer film 3 is covered with the first insulation layer 12. With this configuration, interfacial peeling inside the lamination layer film 3 is unlikely to be generated.

Figure 5A:
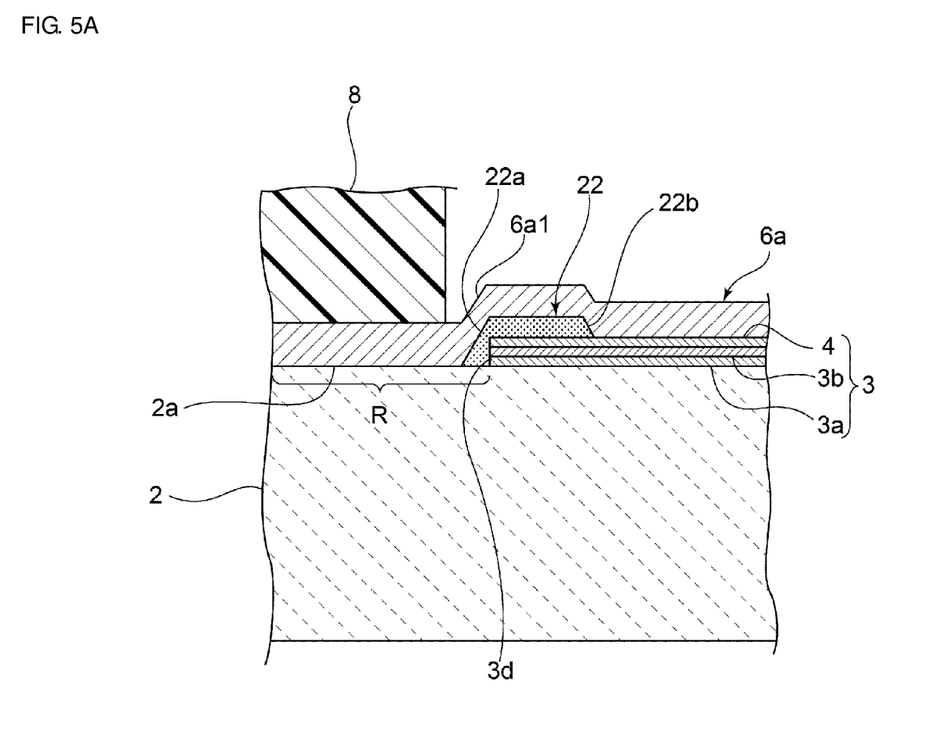
FIG. 5A is a partial cutout enlarged cross-sectional view for describing a major section of an elastic wave device according to a second preferred embodiment of the present invention.
Figure 5B:
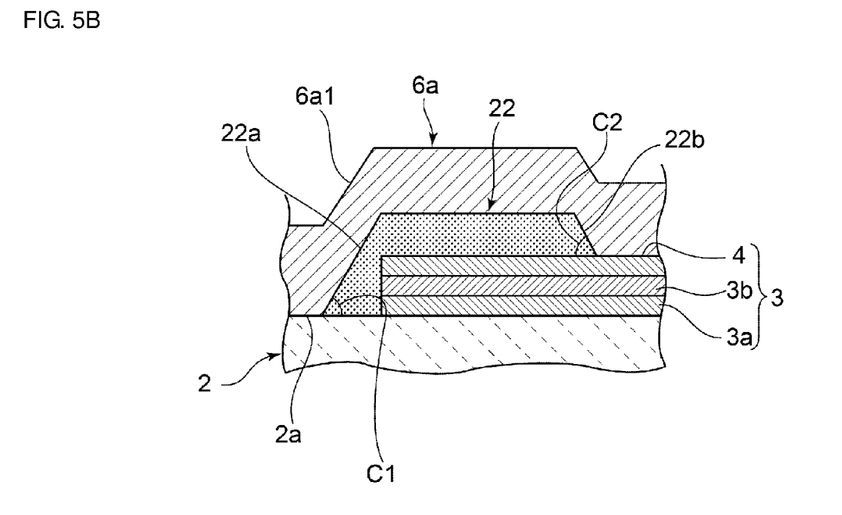
FIG. 5B is a partial cutout cross-sectional view in which a major section in FIG. 5A is further enlarged and illustrated.

FIG. 5A is a partial cutout enlarged cross-sectional view illustrating a major section of an elastic wave device according to a second preferred embodiment of the present invention, and FIG. 5B is a partial cutout cross-sectional view in which the major section is further enlarged and illustrated. FIGS. 5A and 5B are cross-sectional views of the portions corresponding to FIGS. 4A and 4B regarding the first preferred embodiment.

In the elastic wave device of the second preferred embodiment, a first insulation layer 22 extends from the region R on the first principal surface 2a of the support substrate 2 to the upper portion of the piezoelectric thin film 4. However, note that the first insulation layer 12 in the elastic wave device of the first preferred embodiment is extended toward the outer side portion in the region R. In contrast, in the second preferred embodiment, one end of a slope 22a of the first insulation layer 22 is in contact with the first principal surface 2a of the support substrate 2. In other words, the first insulation layer 22 is not extended to the outer side portion of the slope 22a. Further, on the piezoelectric thin film 4, similar to the first preferred embodiment, a slope 22b extending to the upper surface of the piezoelectric thin film 4 is provided.

As shown in FIG. 5B, it is preferable that an angle C1 between the slope 22a and the first principal surface 2a as well as an angle C2 between the slope 22b and the first principal surface 2a be no more than about 80 degrees, for example, as in the first preferred embodiment.

It is more preferable that the angle C1 between the slope 22a and the first principal surface 2a as well as the angle C2 between the slope 22b and the first principal surface 2a be no more than about 60 degrees, for example. It is even more preferable that the angle C1 between the slope 22a and the first principal surface 2a as well as the angle C2 between the slope 22b and the first principal surface 2a be no more than about 45 degrees, for example.

In this manner, the formation of the first insulation layer 22 may extend from a portion positioned on the upper side of the piezoelectric thin film 4 and end at the slope 22a extending toward the region R side. Also in this case, similar to the first preferred embodiment, by bonding under-bump metal layers and metal bumps onto the wiring electrode 6a in the region R, chipping, cracking, or other damage of the piezoelectric thin film 4 is unlikely to be generated. Because the wiring electrode 6a includes the slope 6a1, breaking of the wiring electrode 6a is also unlikely to be generated.

Figure 6:
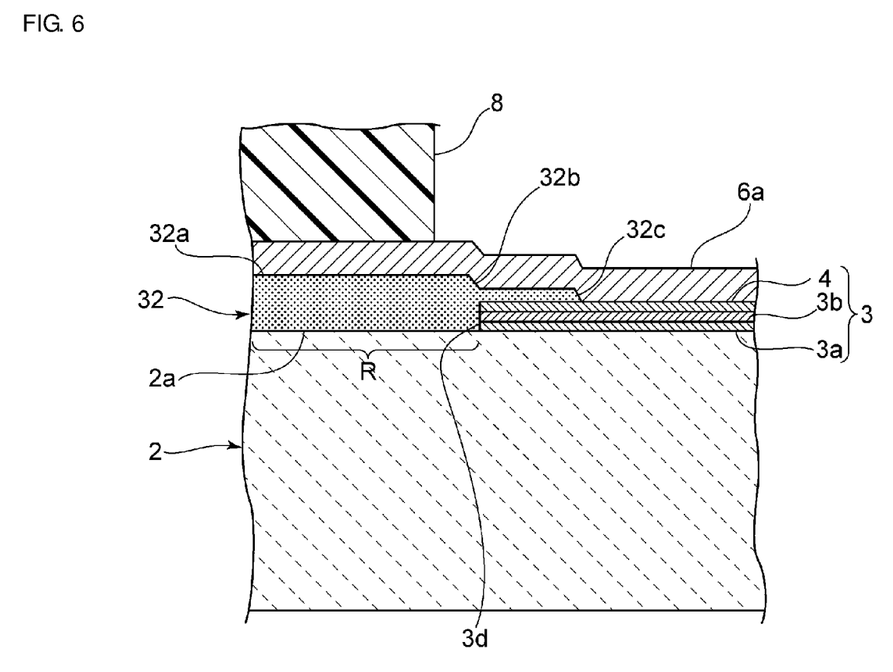
FIG. 6 is a partial cutout enlarged cross-sectional view illustrating a major section of an elastic wave device according to a third preferred embodiment of the present invention.

FIG. 6 is a partial cutout cross-sectional view illustrating a major section of an elastic wave device according to a third preferred embodiment of the present invention. In the third preferred embodiment, an upper surface of a first insulation layer 32 is higher in the region R than the piezoelectric thin film 4. In other words, a thickness of the first insulation layer 32 in the region R is thicker than a sum total of a thickness of the lamination layer film 3 and a thickness of the first insulation layer 32 on the piezoelectric thin film 4. As such, a step defined by a difference in the above-mentioned thicknesses is provided on a surface of the first insulation layer 32 on the opposite side to the first principal surface 2a. This step portion is referred to as a slope 32b in the present preferred embodiment.

The slope 32b approaches the piezoelectric thin film 4 as the slope extends toward the piezoelectric thin film 4 side from the upper side of the region R. Here, the slope 32b is spaced from the first principal surface 2a as the slope extends toward the region R side from the piezoelectric thin film 4 side. It is preferable that an angle between the slope 32b and the first principal surface 2a be also no more than about 60 degrees, for example, similar to the angle C1 in the first and second preferred embodiments.

On the piezoelectric thin film 4, the first insulation layer 32 includes a slope 32c as in the first and second preferred embodiments. It is preferable that an angle between the slope 32c and the first principal surface 2a be no more than about 60 degrees, for example. This greatly reduces the likelihood for the wiring electrode 6a to be broken on the slopes 32b and 32c.

As in the elastic wave device of the third preferred embodiment, an upper surface 32a of the first insulation layer 32 may preferably be made to be relatively high in the region R.

The elastic wave device of the third preferred embodiment differs from the elastic wave devices of the first and second preferred embodiments in the following points: the first insulation layer 32, thickness distribution of the first insulation layer 32, orientation of the slope 32b, and orientation of the slope in the wiring electrode 6a. However, in other points, the elastic wave device of the third preferred embodiment is preferably structured in the same or similar manner as the first and second preferred embodiments.

Figure 7:
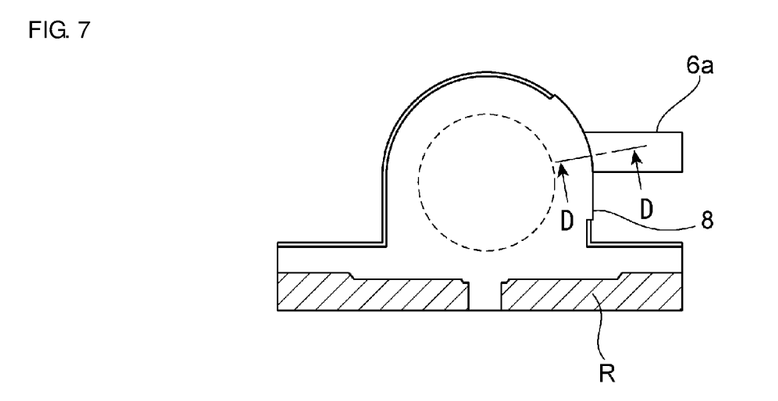
FIG. 7 is a schematic plan view illustrating a major section of an elastic wave device according to a fourth preferred embodiment of the present invention.
Figure 8:
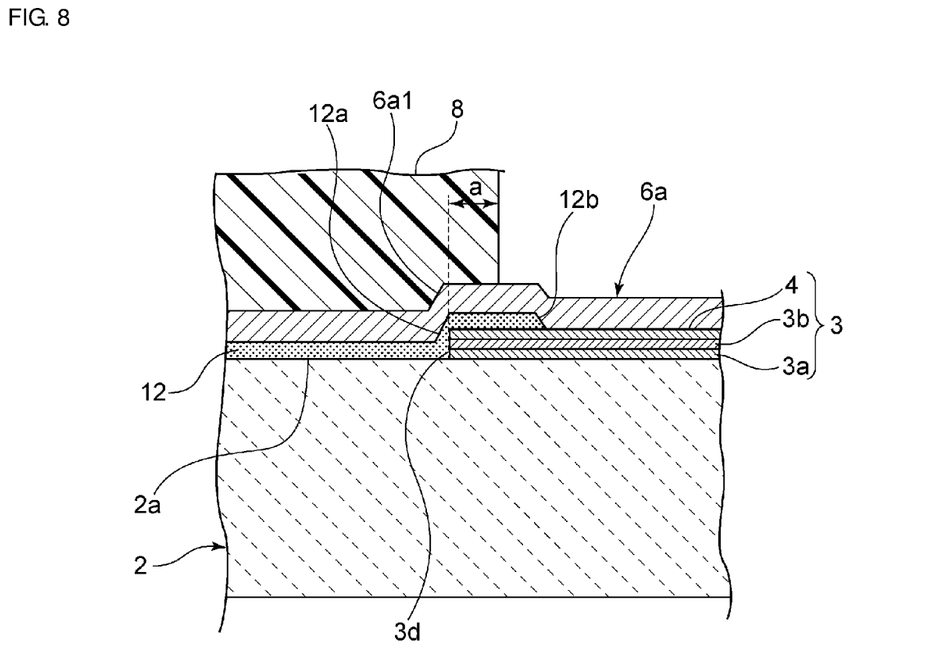
FIG. 8 is a partial cutout enlarged cross-sectional view illustrating the major section of the elastic wave device according to the fourth preferred embodiment of the present invention.

FIG. 7 is a schematic plan view for describing a section of an elastic wave device according to a fourth preferred embodiment of the present invention where electrode lands are provided. FIG. 8 illustrates a cross section of a portion along a D-D arrow line in FIG. 7.

In the elastic wave device of the fourth preferred embodiment, an inner side end of the support layer 8 is extended to an upper side position of the piezoelectric thin film 4. In other words, the inner side end of the support layer 8 is extended from the side surface 3d of the lamination layer film 3 toward the inner side by a dimension "a" in FIG. 8. The dimension "a" is a distance between the side surface 3d of the lamination layer film 3 and the inner side end of the support layer 8. It is sufficient for the dimension "a" to be greater than 0. In this manner, the inner side end of the support layer 8 may extend to the upper side of the piezoelectric thin film 4.

The support layer 8 extends to the upper side position of the piezoelectric thin film 4. Accordingly, resistance of the wiring electrode 6a against the stress from the support layer 8 is improved. Note that, the above dimension "a" may be 0.

Figure 9:
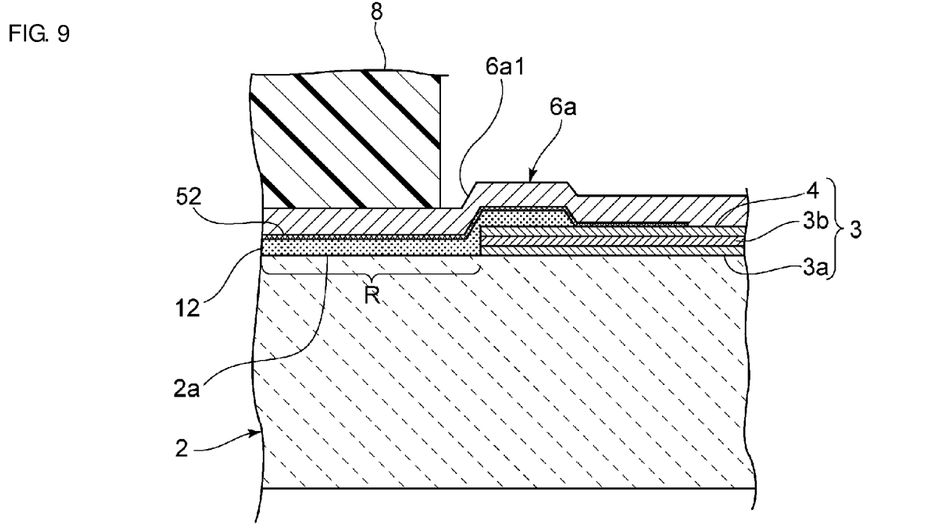
FIG. 9 is a partial cutout enlarged cross-sectional view illustrating a major section of an elastic wave device according to a fifth preferred embodiment of the present invention.

FIG. 9 is a partial cutout enlarged cross-sectional view illustrating a major section of an elastic wave device according to a fifth preferred embodiment of the present invention. In the elastic wave device of the fifth preferred embodiment, a second insulation layer 52 is laminated so as to cover the first insulation layer 12. The second insulation layer is preferably made of an insulative material different from that of the first insulation layer 12. The second insulation layer 52 is preferably made of an inorganic insulative material. As the inorganic insulative material, silicon oxide, silicon nitride, silicon oxynitride, or other suitable material may preferably be used.

The second insulation layer 52 made of an inorganic insulative material is provided, and the wiring electrode 6a is provided on the second insulation layer 52. This makes it possible to improve adhesiveness between the wiring electrode 6a and the second insulation layer 52. As such, by using synthetic resin as the first insulation layer 12 and using an inorganic insulative material as the second insulation layer 52, peeling is unlikely to be generated in the electrode land section. As discussed above, in the electrode land section to which the under-bump metal layer and the metal bump are bonded, a large stress is applied to the electrode land section of the wiring electrode 6a when the metal bump is bonded. In this case, there is a risk that the stress causes the peeling of the electrode land and other damage. However, by providing the second insulation layer 52 as described above, the above-mentioned peeling is effectively reduced or prevented.

Figure 10:
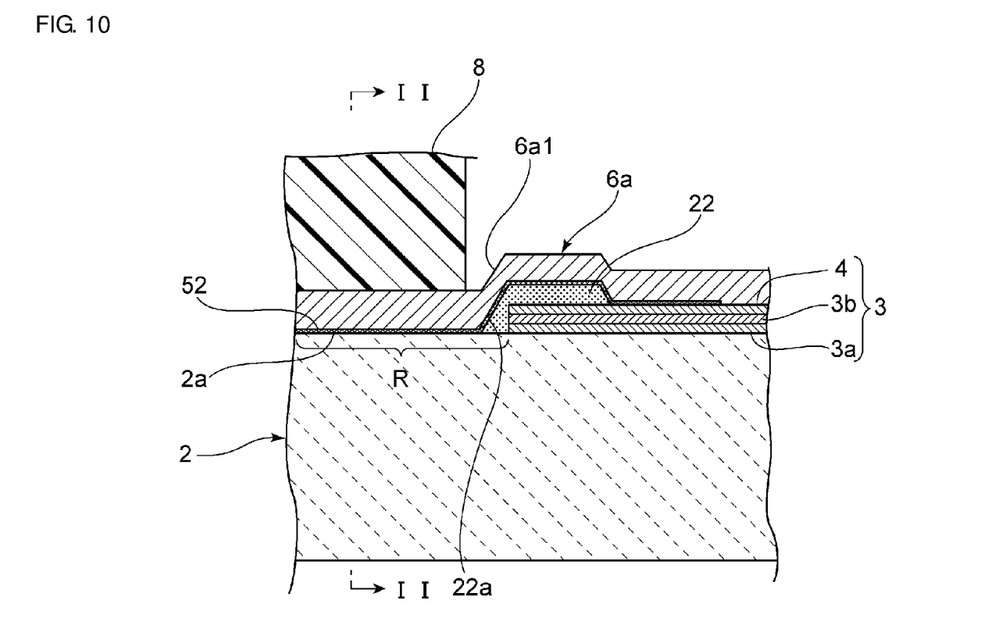
FIG. 10 is a partial cutout enlarged cross-sectional view illustrating a major section of an elastic wave device according to a sixth preferred embodiment of the present invention.

FIG. 10 is a partial cutout enlarged cross-sectional view illustrating a major section of an elastic wave device according to a sixth preferred embodiment of the present invention. Also in the sixth preferred embodiment, similar to the fifth preferred embodiment, the second insulation layer 52 is provided. In the sixth preferred embodiment, as in the elastic wave device of the second preferred embodiment, the lower end of the slope 22a of the first insulation layer 22 is in contact with the first principal surface 2a in the region R. Accordingly, the second insulation layer 52 preferably covers the first insulation layer 22, and extends, further in the region R, to a region in an outer side portion relative to the first insulation layer 22. It is preferable that, as illustrated in FIG. 10, the second insulation layer 52 be extended to cover all or substantially all of the region where the wiring electrode 6a is disposed in the outer side portion of the piezoelectric thin film 4 and the first insulation layer 22. With this, peeling of the wiring electrode 6a in the electrode land section is more effectively reduced or prevented.

Because the elastic wave devices of the fifth and sixth preferred embodiments are the same or substantially the same in structure, except that the second insulation layer 52 is provided, as those of the first and second preferred embodiments, the same advantageous effects is obtained as the first and second preferred embodiments.

Figure 11:
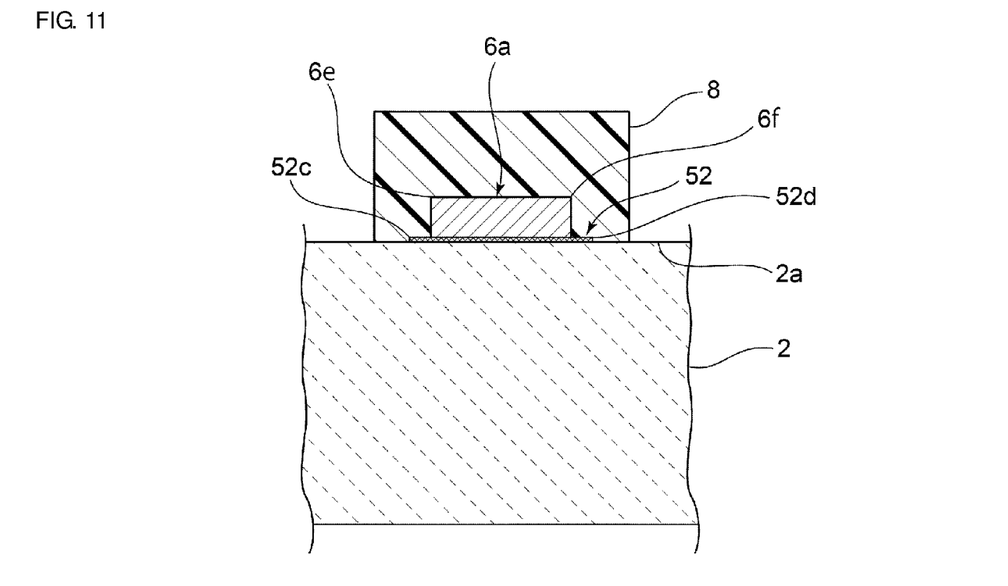
FIG. 11 is a cross-sectional view of a major section of a portion along a line II-II in FIG. 10.

FIG. 11 is a cross-sectional view of a portion corresponding to a portion along a line II-II in FIG. 10. In FIG. 10, the wiring electrode 6a extends from the upper portion of the piezoelectric thin film 4 towards the region R side. A direction orthogonal or substantially orthogonal to this extending direction is denoted as a width direction. FIG. 11 illustrates a cross section along the width direction.

As illustrated in FIG. 11, it is preferable that one end 6e and another end 6f in the width direction of the wiring electrode 6a be positioned on an inner side in the width direction relative to one end 52c and another end 52d in the width direction of the second insulation layer 52. This makes it possible to reduce or prevent a leakage current between the wiring electrode 6a and the support substrate 2.

Figure 12:
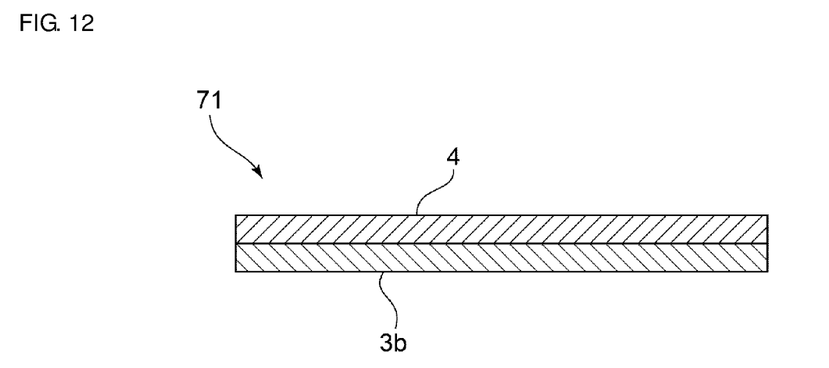
FIG. 12 is a front cross-sectional view illustrating a lamination layer film used in a seventh preferred embodiment of the present invention.

FIG. 12 is a front cross-sectional view of a lamination layer film used in an elastic wave device according to a seventh preferred embodiment of the present invention. In the seventh preferred embodiment, a lamination layer film 71 includes the low acoustic velocity film 3b and the piezoelectric thin film 4. A high acoustic velocity film may not be provided as in the lamination layer film 71. The elastic wave device according to the seventh preferred embodiment is the same or substantially the same in structure, except that the lamination layer film 71 is used instead of the lamination layer film 3, as that of the first preferred embodiment. Therefore, the same or similar effect is obtained as the first preferred embodiment.

Figure 13:
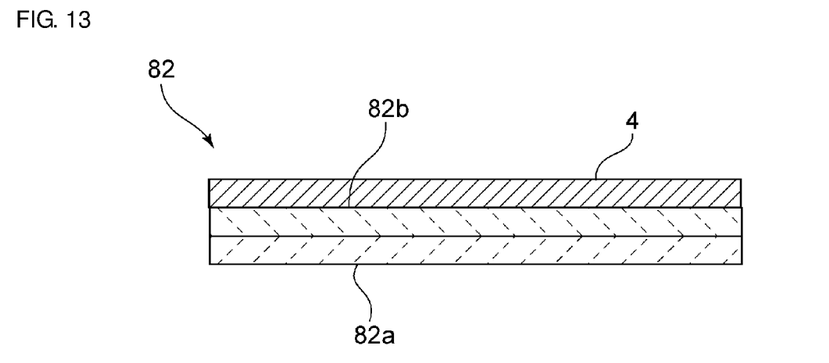
FIG. 13 is a front cross-sectional view illustrating a lamination layer film used in an eighth preferred embodiment of the present invention.

FIG. 13 is a front cross-sectional view of a lamination layer film used in an elastic wave device according to an eighth preferred embodiment of the present invention. In the eighth preferred embodiment, a lamination layer film 82 has a structure in which a low acoustic impedance film 82b having relatively low acoustic impedance is laminated on a high acoustic impedance film 82a having relatively high acoustic impedance. The piezoelectric thin film 4 is laminated on the low acoustic impedance film 82b. The lamination layer film 82 may be used in place of the lamination layer film 3. As discussed above, in various preferred embodiments of the present invention, the lamination layer film is not limited to a lamination film including the high acoustic velocity film and the low acoustic velocity film, and may have a structure in which a high acoustic impedance film and a low acoustic impedance film are laminated.

Figure 15:
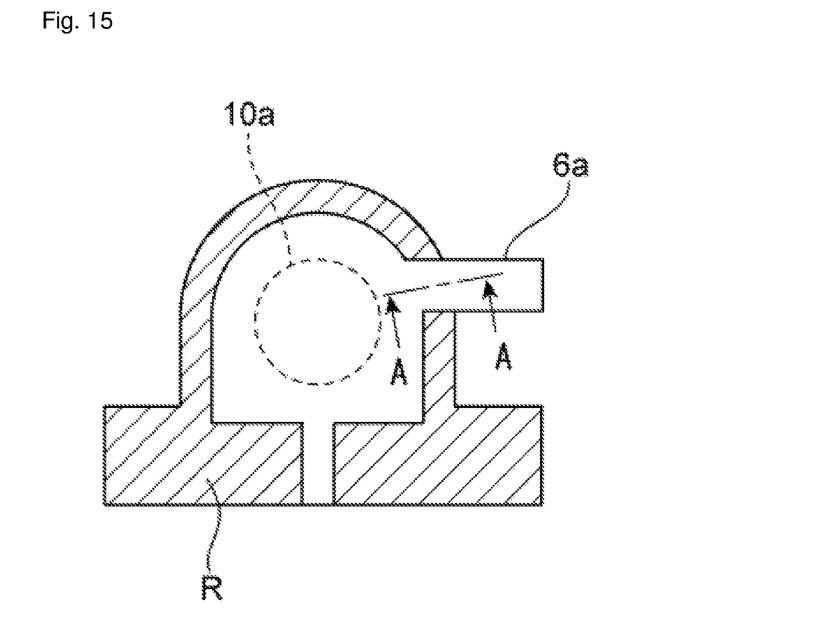
FIG. 15 is a plan view for describing a major section of an elastic wave device according to a preferred embodiment of the present invention.
Figure 16:
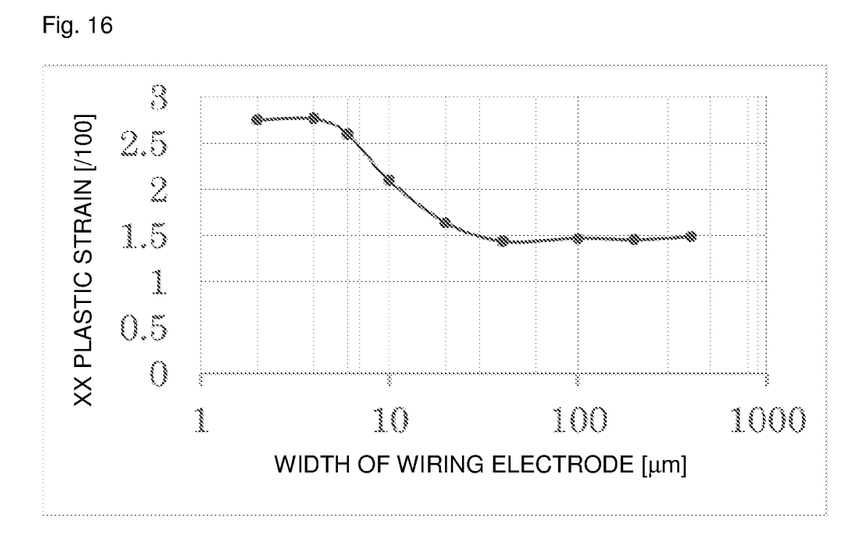
FIG. 16 is a graph showing a relationship between the width of the wiring electrode and plastic strain.

In an elastic wave device according to another preferred embodiment of the present invention, it is preferable for a width W of the wiring electrode 6a illustrated in FIG. 15 to be no less than about 6 μm, for example. FIG. 16 is a graph showing a relationship between the width W of the wiring electrode 6a and plastic strain.

Note that the plastic strain in FIG. 16 is, for example, plastic strain of the wiring electrode 6a at a temperature of about −75° C. More specifically, the plastic strain in FIG. 16 refers to plastic strain at a lower end of a slope of the wiring electrode 6a illustrated in FIG. 4A. The lower end of the slope of the wiring electrode 6a is a bent portion of the wiring electrode 6a above the inner side end 12c of the first insulation layer 12. The slope of the wiring electrode 6a is a slope, above the lamination layer film 3, which is sloped toward the lamination layer film 3. The result of the plastic strain is a result of a thermal stress simulation analysis by a finite element method using FEMTET®. Note that in FIG. 4A, the wiring electrode 6a extends from the upper portion of the piezoelectric thin film 4 toward the region R. A direction orthogonal or substantially orthogonal to this extending direction and the thickness direction is a width direction in which the width W of the wiring electrode 6a is provided.

In the present preferred embodiment, it is preferable for the width W of the wiring electrode 6a to be no less than about 6 μm, for example. As shown in FIG. 16, in the case in which the width W of the wiring electrode 6a is no less than about 6 μm, the value of the plastic strain decreases sharply, and the value thereof becomes no more than about 2.0 in the case in which the width W of the wiring electrode 6a is no less than about 10 μm, for example. Typically, tensile stress is generated in the case in which the plastic strain becomes large in a positive direction. This may cause the wiring electrode 6a to break or be damaged. However, in the present preferred embodiment, since the width W of the wiring electrode 6a is preferably no less than about 6 μm, the wiring electrode 6a is less likely to be damaged or break. Although the upper limit of the width W of the wiring electrode 6a is not specifically limited, it may be set to about 120 μm, for example, because a bump pad is typically approximately 100 μm.

Figure 17:
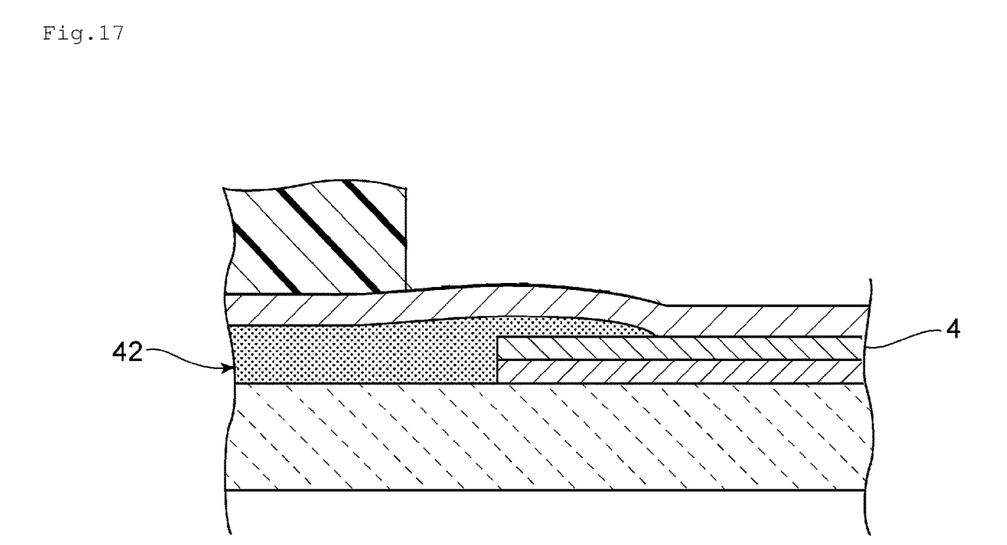
FIG. 17 is a partial cutout enlarged cross-sectional view of a portion along an A-A line in FIG. 15.

In an elastic wave device according to another preferred embodiment of the present invention, a first insulation layer 42 may preferably have a rounded shape on a piezoelectric thin film 4, as illustrated in FIG. 17.

In addition, in preferred embodiments of the present invention, the configuration of a lamination layer film including a piezoelectric thin film is not limited to any specific configuration.

Accordingly, the lamination layer film may be formed by laminating a plurality of dielectric films in order to improve temperature characteristics.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
    a support substrate;
    a lamination layer film provided on the support substrate and including a plurality of films including a piezoelectric thin film;
    an interdigital transducer (IDT) electrode provided on one surface of the piezoelectric thin film;
    a first insulation layer provided in a region located at an outer side portion of a region where the IDT electrode is provided and extending from at least a portion of a region where the lamination layer film is not present to an upper portion of the piezoelectric thin film in a plan view; and
    a wiring electrode electrically connected to the IDT electrode, extending from the upper portion of the piezoelectric thin film to an upper portion of the first insulation layer, and extending onto a section of the first insulation layer positioned in the region where the lamination layer film is not present; wherein
    a width of the wiring electrode is no less than about 6 μm.

2. The elastic wave device according to claim 1, wherein the first insulation layer extends from the upper portion of the piezoelectric thin film, passing over a side surface of the lamination layer film, to at least the portion of the region where the lamination layer film is not present.

3. The elastic wave device according to claim 1, wherein a surface on the first insulation layer, which is on an opposite side to the support substrate, includes a slope that gets closer to the piezoelectric thin film side as the slope approaches a section on the piezoelectric thin film from the region where the lamination layer film is not present.

4. The elastic wave device according to claim 3, wherein the slope of the first insulation layer extends from an upper portion of the support substrate to a section of the first insulation layer on the piezoelectric thin film.

5. The elastic wave device according to claim 4, wherein
the slope is spaced farther from the support substrate side as the slope extends from the piezoelectric thin film side toward a side of the region where the lamination layer film is not present; and
the first insulation layer is thicker in the region where the lamination layer film is not present than in the region on the piezoelectric thin film.

6. The elastic wave device according to claim 4, further comprising:
a support layer provided on the support substrate, covering a portion of a region where the wiring electrode is provided, and including a cavity defining a hollow space; wherein
the support layer extends beyond the slope of the first insulation layer to the upper portion of the first insulation layer on the piezoelectric thin film.

7. The elastic wave device according to claim 3, wherein the first insulation layer extends from the slope to the region where the lamination layer film is not present.

8. The elastic wave device according to claim 7, further comprising:
a support layer provided on the support substrate and including a cavity defining a hollow space; wherein
the support layer extends on the support substrate from the region where the wiring electrode is provided to an end portion on the piezoelectric thin film side of the slope.

9. The elastic wave device according to claim 3, wherein one end of the slope of the first insulation layer directly contacts the support substrate.

10. The elastic wave device according to claim 1, wherein the first insulation layer has a rounded shape on the piezoelectric thin film.

11. The elastic wave device according to claim 1, wherein
the lamination layer film includes the piezoelectric thin film and a low acoustic velocity film in which an acoustic velocity of a bulk wave propagating in the low acoustic velocity film is less than an acoustic velocity of an elastic wave propagating in the piezoelectric thin film; and
the piezoelectric thin film is laminated on the low acoustic velocity film.

12. The elastic wave device according to claim 1, wherein
the lamination layer film includes the piezoelectric thin film, a high acoustic velocity film in which an acoustic velocity of a bulk wave propagating in the high acoustic velocity film is larger than an acoustic velocity of an elastic wave propagating in the piezoelectric thin film, and a low acoustic velocity film, laminated on the high acoustic velocity film, in which an acoustic velocity of a bulk wave propagating in the low acoustic velocity film is less than the acoustic velocity of the elastic wave propagating in the piezoelectric thin film; and
the piezoelectric thin film is laminated on the low acoustic velocity film.

13. The elastic wave device according to claim 1, wherein the lamination layer film includes the piezoelectric thin film, a high acoustic impedance film having relatively high acoustic impedance, and a low acoustic impedance film having lower acoustic impedance than the high acoustic impedance film.

14. The elastic wave device according to claim 1, wherein the first insulation layer is made of synthetic resin.

15. The elastic wave device according to claim 14, wherein the synthetic resin is at least one of polyimide and epoxy.

16. The elastic wave device according to claim 1, wherein the first insulation layer is made of an inorganic insulative material.

17. The elastic wave device according to claim 16, wherein the inorganic insulative material is at least one of SOG, $SiO_2$, TEOS, and SiN.

18. The elastic wave device according to claim 1, further comprising:
a second insulation layer provided between the wiring electrode and the support substrate; wherein
the second insulation layer extends to the upper portion of the first insulation layer.

19. The elastic wave device according to claim 18, wherein, a direction orthogonal or substantially orthogonal to a direction in which the wiring electrode extends is denoted as a width direction, one end and another end in the width direction of the wiring electrode are respectively positioned on an inner side in the width direction relative to one end and another end in the width direction of the second insulation layer.

* * * * *